United States Patent
Hattendorf et al.

(10) Patent No.: US 7,595,248 B2
(45) Date of Patent: Sep. 29, 2009

(54) ANGLED IMPLANTATION FOR REMOVAL OF THIN FILM LAYERS

(75) Inventors: Michael L. Hattendorf, Beaverton, OR (US); Justin K. Brask, Portland, OR (US); Justin S. Sandford, Tigard, OR (US); Jack Kavalieros, Portland, OR (US); Matthew V. Metz, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 464 days.

(21) Appl. No.: 11/293,753

(22) Filed: Dec. 1, 2005

(65) Prior Publication Data
US 2007/0126067 A1 Jun. 7, 2007

(51) Int. Cl.
*H01L 21/265* (2006.01)
(52) U.S. Cl. .............................. 438/302; 257/E21.248
(58) Field of Classification Search .................. 438/184, 438/585, 586, 197, 230, 302; 257/E21.205, 257/E21.345, E21.312, E21.335, E21.194, 257/E21.248, E21.251, E21.311, E21.144, 257/E21.444, E29.135, E29.16, E29.159
See application file for complete search history.

(56) References Cited

U.S. PATENT DOCUMENTS

| | | | |
|---|---|---|---|
| 4,385,938 A | 5/1983 | Park et al. .................... 438/520 |
| 4,652,334 A | 3/1987 | Jain et al. .................... 438/756 |
| 5,516,707 A | 5/1996 | Loh et al. | |
| 5,801,069 A | 9/1998 | Harada et al. ................. 438/52 |
| 5,915,196 A | 6/1999 | Mineji ......................... 438/526 |
| 5,937,299 A | 8/1999 | Machael et al. | |
| 6,008,098 A | 12/1999 | Pramanick et al. .......... 438/305 |
| 6,018,179 A | 1/2000 | Gardner et al. | |
| 6,060,375 A | 5/2000 | Owyang et al. | |
| 6,433,371 B1 | 8/2002 | Scholer et al. | |
| 6,475,841 B1 * | 11/2002 | Taylor et al. ................. 438/197 |
| 6,511,876 B2 | 1/2003 | Buchanan et al. ........... 438/240 |
| 6,855,639 B1 | 2/2005 | Brask et al. ................. 438/742 |
| 2002/0008293 A1 | 1/2002 | Kuroi et al. | |
| 2002/0142519 A1 | 10/2002 | Coronel et al. .............. 438/118 |

(Continued)

FOREIGN PATENT DOCUMENTS

EP  0 637 066 A1  2/1994

(Continued)

OTHER PUBLICATIONS

Chatterjee, A., et al.; "CMOS metal replacement gate transistors using tantalum pentoxide gate insulator"; Electron Devices Meeting, 1998; IEDM '98 Technical Digest; International San Francisco, CA., USA; Dec. 6-9, 1998; XP010321546, pp. 777-780.

(Continued)

*Primary Examiner*—Thomas L Dickey
*Assistant Examiner*—Fazli Erdem
(74) *Attorney, Agent, or Firm*—Kathy J. Ortiz

(57) ABSTRACT

Embodiments of the invention provide a device with a reverse-tapered gate electrode and a gate dielectric layer with a length close to that of the gate length. In an embodiment, this may be done by altering portions of a blanket dielectric layer with one or more angled ion implants, then removing the altered portions of the blanket dielectric layer.

8 Claims, 8 Drawing Sheets

U.S. PATENT DOCUMENTS

| | | | |
|---|---|---|---|
| 2003/0211684 A1* | 11/2003 | Guo ........................ 438/230 |
| 2003/0227055 A1 | 12/2003 | Bae et al. | |
| 2003/0230549 A1 | 12/2003 | Buchanan et al. ............. 705/40 |
| 2004/0038555 A1 | 2/2004 | Sugita et al. | |

FOREIGN PATENT DOCUMENTS

| | | |
|---|---|---|
| EP | 1511074 A | 3/2005 |
| EP | 1524699 A | 4/2005 |
| FR | 2757312 A1 | 6/1998 |
| KR | 2004/021775 A | 3/2004 |
| WO | WO 01/71818 A | 9/2001 |

OTHER PUBLICATIONS

Saenger, K. L., et al.; "A selective etching process for chemically inert high-k metal oxides"; Materials Research Society Symposium Proceedings, Materials Research Society, Pittsburg, PA. USA; vol. 745; Dec. 2, 2002; XP008029222; pp. 79-84.

International Search Report and Written Opinion; International Application No.: PCT/US2006/046174; Date of mailing: Apr. 16, 2007; pp. 1-14.

Materials Research Society Proceedings, Symposium N, "Novel Materials and Processes for Advanced CMOS" Dec. 2-4, 2002.

Database Inspec [Online] Institute of Electrical Engineers, Stevenage, GB: Inspec No. Fifth Symposium UCPSS 2002—Ostendm Belgium, Sep. 2002, Barnet J. et al. "Wet Etch Enchancement of HF02 Films by Implant Processing", Database accession No. 7665578 abstract, Solid State Phenomena, Diffusion and Defect Date B, vol. 92, 2003, pp. 11-14, XP008029227.

Database Inspec [Online] Institute of Electrical Engineers, Stevenage, GB: Inspec No. MSR Symposium, vol. 745—Boston, MA, Dec. 2, 2002, Saenger K.L. et al. "A Selective Etching Process for Chemically Inert High-K Metal Oxides", Database accession No. 7824165 abstract, Novel Materials and Processes for Advanced CMOS, pp. 79-84, XP008029222.

Database WPI, Section Ch, Week 200266, Derwent Publications Ltd, London, GB; Class L03 AN 2002-6154283 XP002275250 and KR 2002 020 507 A (Samsung Electronics Co Ltd) Mar. 2002, abstract.

International Search Report PCT/US 03/36372.

Scott A. Hareland et al., "Pre-Etch Implantation Damage for the Removal of Thin Film Layers", U.S. Appl. No. 10/324,305, filed Dec. 18, 2002.

Justin K. Brask et al., "A Selective Etch Process for Making a Semiconductor Device Having a High-K Gate Dielectric", U.S. Appl. No. 10/652,546, filed Aug. 28, 2003.

Uday Shah et al., "A Replacement Gate Process for Making a Semiconductor Device that Includes a Metal Gate Electrode", U.S. Appl. No. 10/809,853, filed Mar. 24, 2004.

Ibrahim Ban et al., "Stepped Tip Junction with Spacer Layer", U.S. Appl. No. 10/882,733, filed Jun. 30, 2004.

* cited by examiner

US 7,595,248 B2

ANGLED IMPLANTATION FOR REMOVAL OF THIN FILM LAYERS

BACKGROUND

Background Of The Invention

Dry etching using tools such as plasma provide directional etching. However, such etching methods lack selectivity and may etch into materials below those desired to be etched, or the materials desired to be etched may be blocked from the plasma by structures above. Certain wet etchants have high selectivity as paired with substrates and target materials. However, many of these wet etchants etch at the same rate in all directions of material exposure (i.e. are isotropic), and may leave excessively large footings or undercuttings.

DETAILED DESCRIPTION

Figure 1A:
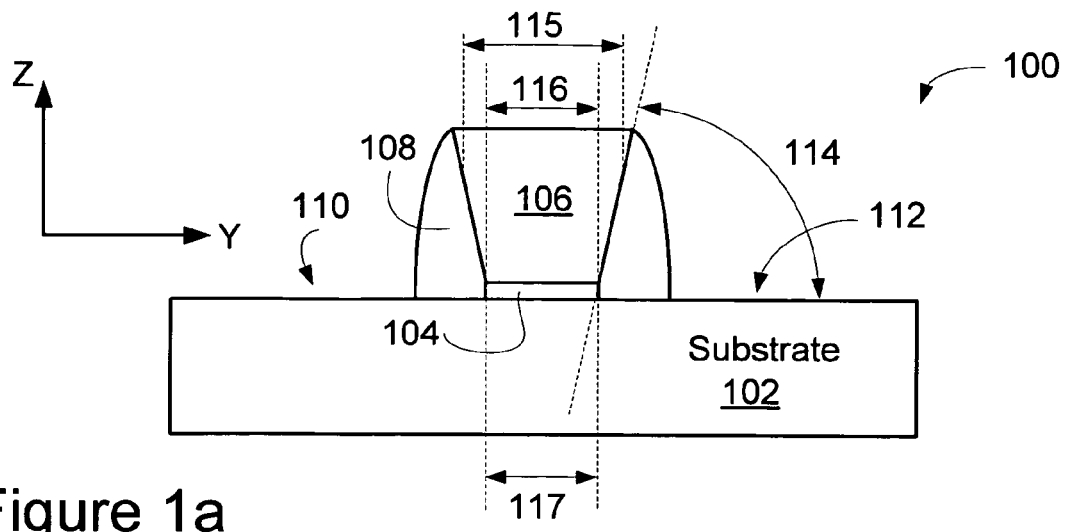
FIGS. 1a through 1e are cross sectional side views that illustrate the semiconductor device of one embodiment of the present invention.

In various embodiments, an apparatus and method relating to the formation of a semiconductor device are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

A device with a reverse-tapered (i.e. wider toward the top than toward the bottom) gate electrode and its method of fabrication is disclosed herein. The device may be a transistor. There is a gate dielectric under the gate electrode. The gate dielectric has a length close to a gate length measured adjacent the gate dielectric. The gate dielectric layer may lack a large footing beyond the gate length and a large undercut beneath the gate electrode. Such large footings and undercuts may decrease transistor performance. The dielectric layer without large footing or undercut may be fabricated by using angled ion implants to alter a blanket dielectric layer, then removing the altered portions.

FIG. 1a is a cross sectional side view that illustrates the semiconductor device 100 of one embodiment of the present invention. In the cross-sectional side view of FIG. 1a, a Z-axis is perpendicular to a top surface of a substrate 102 and an X-Y plane (X is not shown as it extends into the plane of the Figure) substantially coincides with a top surface of the substrate 102. As used herein, the "length" of portions of the device 100 is measured in the Y direction and the height in the Z direction. As used herein, angles are measured from the X-Y plane, with an angle perpendicular to the X-Y plane (in the Z-direction) being the maximum possible angle, of ninety degrees. Thus two angles referred to here may be the same number of degrees from the X-Y plane, but may be oriented in a different direction so that they point away from each other.

The device 100 may be a transistor formed on the substrate 102 in some embodiments. Substrate 102 may comprise any material that may serve as a foundation upon which a semiconductor device may be built. The substrate 102 may be a silicon containing substrate 102. In an embodiment, the substrate 102 may comprise a semiconductor material such as single crystal silicon, gallium arsenide or another suitable material. In some embodiments, the substrate 102 may be a bulk semiconductor substrate 102, while in other embodiments, the substrate 102 may be a semiconductor-on-insulator ("SOI") substrate. The substrate 102 may include multiple different layers and structures in some embodiments, while in other embodiments the substrate 102 may just be one layer of material.

There may be a gate dielectric layer 104 on the substrate 102 in some embodiments. The gate dielectric layer 104 may comprise a material with a high dielectric constant value. Such materials are referred to as high-k materials. The gate dielectric layer 104 may comprise, for example, hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Although a few examples of materials that may be used to form a high-k gate dielectric layer 104 are described here, the gate dielectric layer 104 may be made from other materials that serve to reduce gate leakage in other embodiments.

In embodiments where the gate dielectric layer 104 comprises a high-k material, the gate dielectric layer 104 may have a k-value higher than about 7.5. In other embodiments, the high-k gate dielectric layer 104 may have a k-value higher than about 10. In other embodiments, the high-k gate dielectric layer 104 may comprise a material with a k-value of about 12, or may comprise a material with a higher k-value than that. In other embodiments, the high-k gate dielectric layer 104 may have a k-value between about 15 and about 25, e.g. $HfO_2$. In yet other embodiments, the high-k gate dielectric layer 104 may have a k-value even higher.

There may be a gate electrode 106 on the gate dielectric layer 104 in some embodiments. Only one layer is shown in the gate electrode 106 illustrated in FIG. 1a. However, in other embodiments, the gate electrode 106 may comprise multiple layers of materials. The gate electrode 106 may comprise a metal gate electrode layer or another material, such as polysilicon. In some embodiments, the gate electrode 106 may comprise a metal gate electrode layer as the only layer of the gate electrode 106 or as one of multiple layers in the gate electrode 106. Such a metal gate electrode layer may be a work function metal layer, which may set a work function of the device 100.

The gate electrode 106 may have reverse-tapered sidewalls in some embodiments. "Reverse-tapered" means the sidewalls generally get further apart toward the top, with each sidewall generally trending wider. The sidewalls may have an angle 114 with respect to the top of the substrate 102. In an embodiment, the sidewall of the gate electrode 114 may have an angle 114 between about eighty-five degrees and about seventy-five degrees, although the angle 114 may be different in other embodiments. FIG. 1a illustrates the gate electrode 106 as having idealized sidewalls, with the angle 114 consistent all the way along the sidewall. In reality, the sidewalls of the gate electrode may not be so consistent. The angle 114 may be measured by imagining a line through a point at the bottom of the gate electrode 106 sidewall, adjacent to the gate dielectric layer 104, and through a point on the sidewall about two-thirds of the way up the height of the gate electrode 106; the angle 114 of this line is considered the angle 114 of the sidewall. As all angles herein are measured from the X-Y plane and none are greater than ninety degrees, both sidewalls may have an angle 114 that is substantially the same, even though they point in different directions. However, as the gate electrode 106 is reverse-tapered rather than tapered, it is clear that the sidewalls generally extend away from each other and each is angled in substantially opposite directions away from the Z-axis.

The gate dielectric layer 104 may have a length 117 and the gate electrode 104 may have a gate length 116. As illustrated in FIG. 1a, the length 117 of the gate dielectric layer 104 may be measured adjacent the gate electrode 106. In some embodiments, the gate length 116 may be substantially the same as the length 117 of the gate dielectric 104, although in other embodiments these lengths 116, 117 may differ.

In an embodiment, the gate length 116 may be between about 18 nanometers and about 22 nanometers. In another embodiment, the gate length 116 may be about twenty-five nanometers or less. In another embodiment, the gate length 116 may be about thirty nanometers or less. In yet other embodiments, the gate length 116 may be greater than thirty nanometers.

The gate electrode 106 may also have an intermediate length 115 greater than the gate length 116. The intermediate length 115 may be at a height further from the substrate 102 than the gate length 116, such as about two-thirds of the way up the gate electrode 106. As the sidewalls of the gate electrode 106 may be reverse-tapered, in such embodiments, the intermediate length 115 is greater than the gate length 116. In an embodiment, the intermediate length 115 may be between about 15% and about 50% greater than the gate length 116. In an embodiment, the intermediate length 115 may be between about 5 nanometers and about 15 nanometers greater than the gate length 116.

There may be spacers 108 on either side of the gate electrode 106. The spacers 108 may comprise any suitable material, such as silicon nitride, aluminum nitride, or another material.

There may be a source region 110 to one side of the gate electrode 106 and a drain region 112 to the other side of the gate electrode 106 in some embodiments. The source and drain regions 110, 112 may be doped regions of the substrate 102 in an embodiment. In another embodiment, the source and drain regions 110, 112 may comprise a source/drain material formed in recesses in the substrate 102.

Figure 1B:
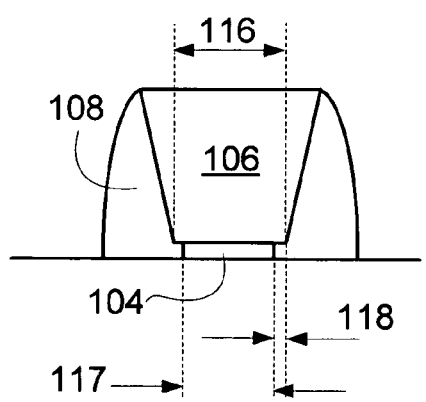
Figure 1C:
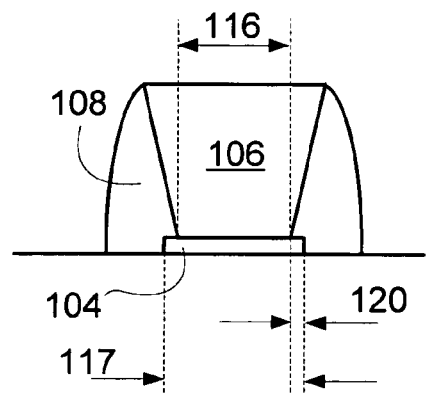

FIGS. 1b and 1c are cross-sectional side views that illustrate embodiments where the dielectric layer length 117 is less than the gate length 116 (FIG. 1b) and greater than the gate length 116 (FIG. 1c).

FIG. 1b is a cross sectional side view that illustrates an embodiment with a dielectric layer 104 with an undercut 118. As illustrated, both sides of the dielectric layer 104 have an undercut 118, although in other embodiments, only one side may have an undercut 118, or one side may have an undercut 118 larger than the other side. In an embodiment, the undercuts 118 of the dielectric layer 104 may be less than about ten angstroms. In an embodiment, the undercuts 118 of the dielectric layer 104 may be less than about three angstroms. In an embodiment, each undercut 118 of the dielectric layer 104 may have a size smaller than about 8% of the gate length 116. In an embodiment, each undercut 118 of the dielectric layer 104 may have a size smaller than about 4% of the gate length 116. In an embodiment, each undercut 118 of the dielectric layer 104 may have a size about 1% of the gate length 116 or smaller. In an embodiment, the combined sizes of undercuts 118 of the dielectric layer 104 may result in the dielectric layer 104 having a length 117 between about 100% the gate length 116 and about 85% the gate length 116. In an embodiment, the combined sizes of undercuts 118 of the dielectric layer 104 may result in the dielectric layer 104 having a length 117 between about 100% the gate length 116 and about 95% the gate length 116. In an embodiment, the combined sizes of undercuts 118 of the dielectric layer 104 may result in the dielectric layer 104 having a length 117 between about 100% the gate length 116 and about 97% the gate length 116. In an embodiment, the combined sizes of undercuts 118 of the dielectric layer 104 may result in the dielectric layer 104 having a length 117 between about 100% the gate length 116 and about 98% the gate length 116. Some embodiments may lack undercuts 118 altogether.

FIG. 1c is a cross sectional side view that illustrates an embodiment with a dielectric layer 104 with a footing 120. As illustrated, both sides of the dielectric layer 104 have footings 120, although in other embodiments, only one side may have a footing 120, or one side may have a footing 120 larger than the other side. In an embodiment, the footings 120 of the dielectric layer 104 may be less than about twenty angstroms. In an embodiment, the footings 120 of the dielectric layer 104 may be less than about six angstroms. In an embodiment, each footing 120 of the dielectric layer 104 may have a size smaller than about 10% of the gate length 116. In an embodiment, each footing 120 of the dielectric layer 104 may have a size smaller than about 5% of the gate length 116. In an embodiment, each footing 120 of the dielectric layer 104 may have a size about 2% of the gate length 116 or smaller. In an embodiment, the combined sizes of footings 120 of the dielectric layer 104 may result in the dielectric layer 104 having a length 117 between about 100% the gate length 116 and about 120% the gate length 116. In an embodiment, the combined sizes of footings 120 of the dielectric layer 104 may result in the dielectric layer 104 having a length 117 between about 100% the gate length 116 and about 110% the gate length 116. In an embodiment, the combined sizes of footings 120 of the dielectric layer 104 may result in the dielectric layer 104 having a length 117 between about 100% the gate length 116 and about 105% the gate length 116. In an embodiment, the combined sizes of footings 120 of the dielectric layer 104 may result in the dielectric layer 104 having a length 117 between about 100% the gate length 116 and about 104% the gate length 116. Some embodiments may lack footings 120 altogether.

Figure 1D:
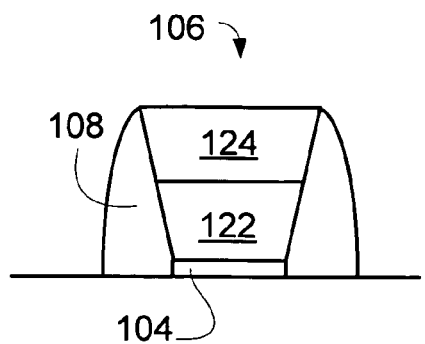
Figure 1E:
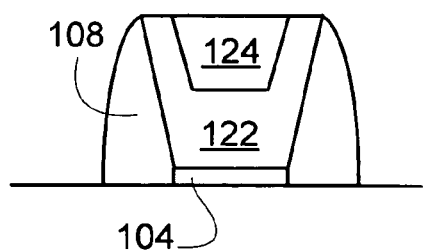

FIGS. 1d and 1e are cross-sectional side views that illustrate two embodiments where the gate electrode 106 comprises multiple layers.

There may be a first gate electrode layer 122 on the dielectric layer 104. The first gate electrode layer 122 may be a metal gate electrode layer 122, although other suitable materials may be used as the first gate electrode layer 122 in other embodiments. The first gate electrode layer 122 may be a work function metal gate layer 122.

The metal work function layer 122 may be an n-type metal gate electrode. Materials that may be used to form n-type metal gate electrodes include: hafnium, zirconium, titanium, tantalum, aluminum, their alloys (e.g., metal carbides that include these elements, i.e., hafnium carbide, zirconium carbide, titanium carbide, tantalum carbide, and aluminum carbide), and aluminides (e.g., an aluminide that comprises hafnium, zirconium, titanium, tantalum, or tungsten).

The metal work function layer 122 may be a p-type metal gate electrode. Materials for forming p-type metal gate electrodes include: ruthenium, palladium, platinum, cobalt, nickel, and conductive metal oxides, e.g., ruthenium oxide.

Rather than n- or p-type, the metal work function layer 122 may be a mid-gap metal gate electrode. In such embodiments, the work function layer 122 may comprise stoichiometric titanium nitride, tantalum nitride, or another mid-gap material.

The device 100 may be a transistor, such as an NMOS, PMOS, or mid-gap transistor. In some embodiments, metal work function layers 122 for NMOS transistor devices 100 may have a workfunction that is between about 3.9 eV and about 4.2 eV. In some embodiments, metal work function layers 122 for PMOS devices 100 may have a workfunction that is between about 4.9 eV and about 5.2 eV. In some embodiments, metal work function layers 122 for semiconductor on insulator (SOI) mid-gap transistor devices 100 may have a workfunction that is between the workfunctions of NMOS and PMOS gate electrode materials. Although a few examples of materials for forming a metal work function layer 122 are identified here, such a component may be made from many other materials, as will be apparent to those skilled in the art.

The work function layer 122 may have a thickness. The thickness of the work function layer 122 may be chosen to provide a desired work function and threshold voltage ($V_{Th}$) of the gate of the device 100. In an embodiment, the thickness may between about 50 angstroms and about 200 angstroms. In an embodiment, the thickness may between about 50 angstroms and about 100 angstroms. In other embodiments, the thickness may be greater than about 75 angstroms. In yet other embodiments, the thickness may be different.

There may be a second gate electrode layer 124 on the first gate electrode layer 122. This second gate electrode layer 124 may comprise another metal or metals, e.g., a metal that may be easily polished like tungsten, aluminum, titanium, or titanium nitride, or a metal with a low resistance. The second gate electrode layer 124 may comprise polysilicon, which may be doped, in other embodiments. The second gate electrode layer 124 may comprise a fill material in some embodiments, to fill some or all of the rest of the volume of the gate electrode 106. Such a material may make up the remainder of the gate electrode 106, or additional layers may be part of the gate electrode 106 as well, below the first gate electrode layer 122, between the first and second gate electrode layers 122, 124, or on the second gate electrode layer 124.

In the embodiment of FIG. 1d, the first gate electrode layer 122 is present only up to a certain height of the gate electrode 106. The second gate electrode layer 124 is on top of the first gate electrode layer 122 and is adjacent the sidewalls. Such a gate electrode 106 may be formed by forming blanket layers of electrode layer 122, 124 material, then removing portions of the blanket layers, leaving gate electrode layers 122, 124, and forming spacers adjacent to the gate electrode 106.

In the embodiment of FIG. 1e, the first gate electrode layer 122 is conformal to the dielectric layer 104 and spacers 108, and extends up substantially to the top of the gate electrode 106. The second gate electrode layer 124 is within the first gate electrode layer 122. However, as used here, the second gate electrode layer 124 is still "on" the first gate electrode layer 122.

FIGS. 2 through 15 illustrate stages in the formation of the device 100 of FIG. 1, according to one embodiment.

Figure 2:
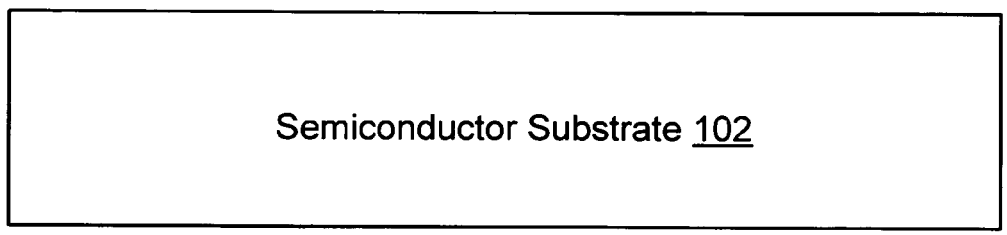
FIG. 2 is a cross sectional side view that illustrates a substrate from which the device may be formed.

FIG. 2 is a cross sectional side view that illustrates a substrate 102 from which the device 100 may be formed according to one embodiment. The substrate 102 may comprise any suitable material from which devices 100 may be formed. In an embodiment, the substrate 102 may be a bulk single crystal silicon material. In other embodiments, other semiconductor materials, such as gallium arsenide, or other materials, may be used for the substrate 102. The substrate 102 may also be a semiconductor-on-insulator ("SOI") substrate 102, with a buried insulator layer. In some embodiments, the substrate 102 may comprise additional layers and/or structures that are not shown in the Figures.

Figure 3:
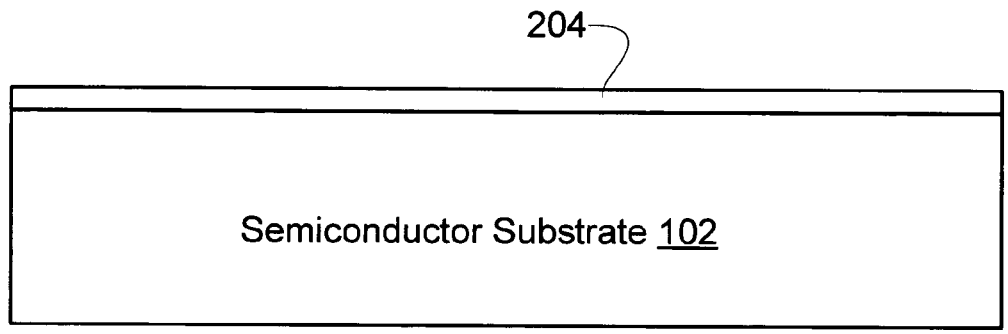
FIG. 3 is a cross sectional side view that illustrates a blanket dielectric layer formed on the substrate.

FIG. 3 is a cross-sectional side view that illustrates a blanket dielectric layer 204 formed on the substrate, according to one embodiment. The blanket dielectric layer 204 may comprise a high-k material in some embodiments. The blanket dielectric layer 204 may comprise, for example, hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. In other embodiments, the blanket dielectric layer 204 (and the dielectric layer 104) may comprise a non-high-k material, such as silicon dioxide. Although a few examples of materials that may be used to form a blanket dielectric layer 204 are described here, the blanket dielectric layer 204 may comprise any suitable material.

Figure 4:
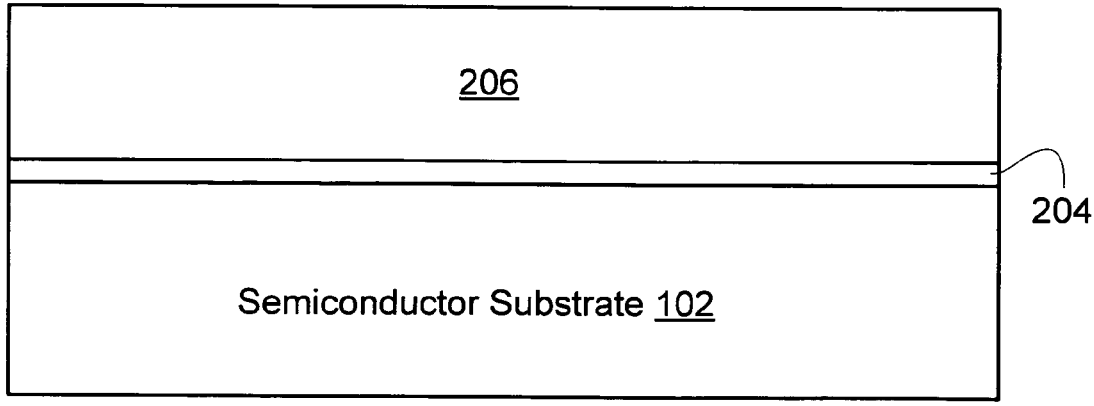
FIG. 4 is a cross-sectional side view that illustrates a blanket gate electrode layer 206 formed on the blanket dielectric layer.

FIG. 4 is a cross-sectional side view that illustrates a blanket gate electrode layer 206 formed on the blanket dielectric layer 204, according to one embodiment. The blanket gate electrode layer 206 may be a sacrificial blanket gate electrode layer 206 in some embodiments, although in other embodiments it may not be. The blanket gate electrode layer 206 may comprise more than one layer in some embodiments, even though only one layer is illustrated in FIG. 4. For example, the blanket gate electrode layer 206 may include a first layer that comprises a metal, such as Ti or TaN, and a second polysilicon layer on the first layer. The first layer may be about twenty to fifty angstroms thick in some embodiments, although it may have a different thickness. The first layer may keep the polysilicon from contacting the dielectric layer 204 in such embodiments. Other materials may also be used.

Figure 5:
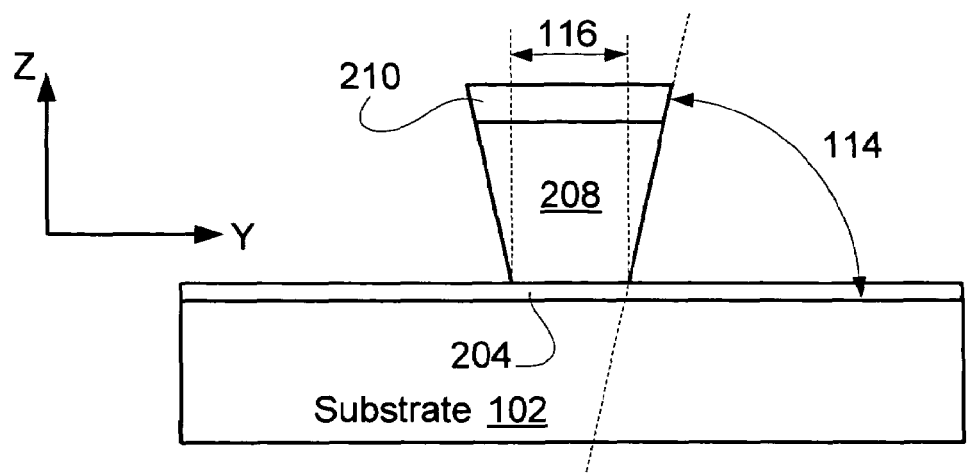
FIG. 5 is a cross-sectional side view that illustrates a first gate that may be formed by patterning the blanket gate electrode layer.

FIG. 5 is a cross-sectional side view that illustrates a first gate 208 that may be formed by patterning the blanket gate electrode layer 206. In an embodiment, a hard mask layer 210 may be formed on the blanket gate electrode layer 206. The hard mask layer 210 may be patterned, and used to pattern the blanket gate electrode layer 206. The first gate 208 may have reverse-tapered sidewalls with a sidewall angle 114 and a gate length 116 as described above with respect to the gate electrode 106. In an embodiment, the reverse-tapered sidewalls may be formed by using a dry etch process to remove portions of the blanket gate electrode layer 206, increasing the bias during the etch to remove more of the blanket gate electrode layer 206 closer to the substrate 102 than further from the substrate 102. Blanket dielectric layer 204 may be electrically charged, which may promote a slightly faster etch rate at the lower part of blanket gate electrode layer 206 than occurs at the upper part of blanket gate electrode layer 206. In other embodiments, other suitable processes may be used. In some embodiments, the first gate electrode 208 may be sacrificial, and removed and replaced with gate electrode 106. In other embodiments, the first gate electrode 208 may remain in place and also be the gate electrode 106. Other embodiments may be a hybrid between these two processes, with part of the first gate electrode 208 being removed and part of the first gate electrode 208 remaining in place to become part of gate electrode 106.

Figure 6:
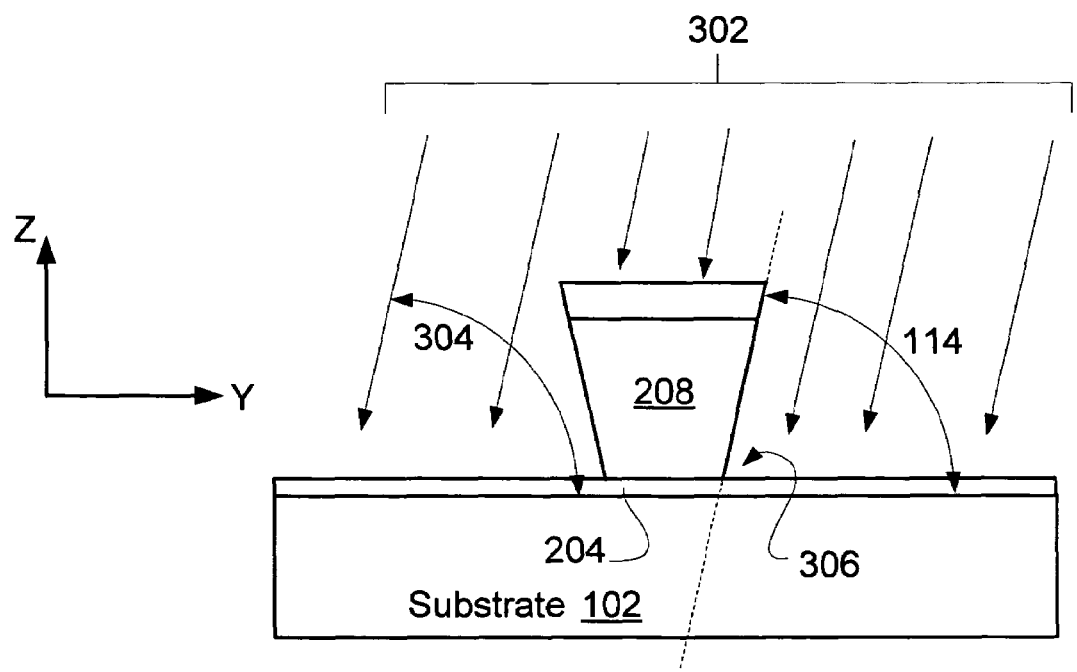
FIG. 6 is a cross-sectional side view that illustrates ions being implanted into portions of the blanket dielectric layer.

FIG. 6 is a cross-sectional side view that illustrates ions 302 being implanted into portions of the blanket dielectric layer 204 to alter those portions of the blanket dielectric layer 204 and make them more susceptible to removal, according to one embodiment. The hard mask layer 210 and first gate electrode 208 protect other portions of the blanket dielectric layer 204 from being altered by the ion 302 implantation. Any suitable method may be used to implant ions 302 into portions of the blanket dielectric layer 204. In an embodiment, the blanket dielectric layer 204 may comprise $HfO_2$ with a thickness between about 0.5 nanometers and about 2 nanometers. In an embodiment, the substrate 102 comprises silicon, and silicon ions 302 are selected for implantation to facilitate a subsequent annealing and recrystallization of the substrate 102, to mitigate structural alteration of the substrate 102 resulting from ion 302 bombardment. The silicon ions may be supplied to an ion implanter by a silicon source, such as silicon fluoride ($SiF_4$). The implantation energy may be between about 200 eV and about 35 keV and the dosage may be between about $2 \times 10^{14}$ cm$^{-2}$ and about $5 \times 10^{15}$ cm$^{-2}$ to implant silicon ions into and through the $HfO_2$ blanket dielectric layer 204. In other embodiments, silicon, germanium, arsenic or other ions may be used. In an embodiment, germanium ions may be implanted at a dosage of about $2 \times 10^{15}$ cm$^{-2}$ and an implantation energy of about 2 keV. In an embodiment, silicon ions may be implanted at a dosage of about $3 \times 10^{15}$ cm$^{-2}$ and an implantation energy of about 2 keV. Rather than a single ion 302 implantation, a series of multiple relatively small implantations may be substituted. In other embodiments, other suitable non-silicon ions 302 may be implanted, ions 302 of multiple elements may be implanted, and different implantation energies may be used.

The ions 302 may be implanted at an angle 304 of ion implantation similar to the angle of one of the sidewalls of the gate electrode 208. For example, in FIG. 6, the ions 302 are implanted at an angle 304 similar to the angle 114 of the right-hand sidewall of the gate electrode 208 and angle 304 may be oriented in substantially the same direction as angle 114. In an embodiment, the angle 304 of ion implantation is within about five degrees of the sidewall angle 114. In an embodiment, the angle 304 of ion implantation is within about two degrees of the sidewall angle 114. In an embodiment, the angle 304 of ion implantation is between about equal to the sidewall angle 114 and about five degrees less than the sidewall angle 114 (e.g., if there is 85 degrees between the sidewall and the X-Y plane, the angle 304 is between about 85 degrees and about 80 degrees in such an embodiment). In an embodiment, the angle 304 of ion implantation is between about equal to the sidewall angle 114 and about two degrees less than the sidewall angle 114. In some embodiments, by having the angle 304 of the ion 302 implantation similar to that of the side wall angle 114, the portion 306 of the blanket dielectric layer 204 adjacent where the sidewall of the first gate electrode 208 may be altered by the ions 302. Were the ions 302 implanted perpendicular to the substrate 102, the larger width toward the top of the first gate electrode 208 would shadow portion 306 and prevent it from being altered by the ions 302. Such a scheme may result in portions of the blanket dielectric layer 204 adjacent the sidewalls of first gate electrode 208 remaining in place so the footings 118 of the dielectric layer 104 are large, thereby reducing the performance of the device 100, or causing other problems with device 100 operation.

Figure 7:
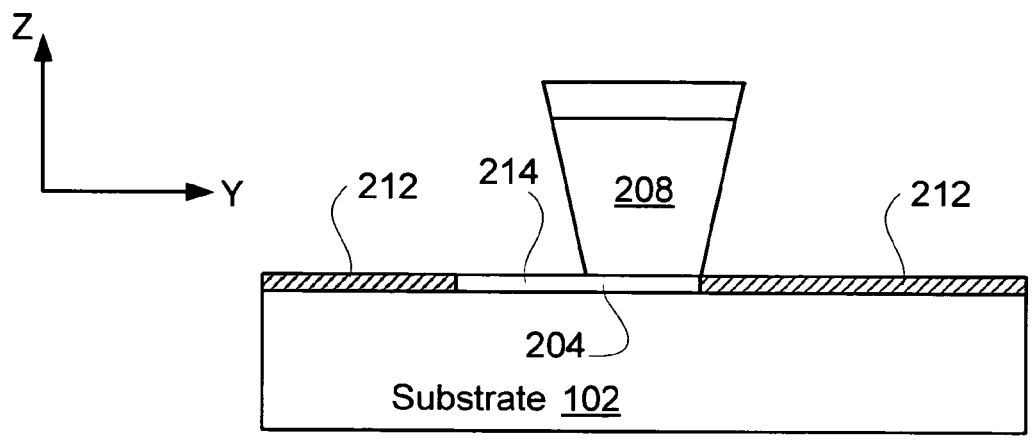
FIG. 7 is a cross-sectional side view that illustrates altered regions of the blanket dielectric layer after ion implantation.

FIG. 7 is a cross-sectional side view that illustrates altered regions 212 of the blanket dielectric layer 204 after ion 302 implantation, according to one embodiment. The altered regions 212 may also be referred to as damaged regions 212. The ions 302 may have structurally altered or damaged the portions of the blanket dielectric layer 204 to result in the altered regions 212. These altered regions 212 may be amorphized or modified by the ions 302, resulting in structural disruption or alteration of the blanket dielectric layer 204, such as bond breakage and/or chemically or physically induced crystal disorganization, which is associated with decreased resistance to outside chemistry. In other words, the implantation causes "structural alteration" of exposed portions of the blanket dielectric layer 204, which makes the altered portion 212 more susceptible to a selected wet etchant than unaltered (also referred to as undamaged) regions 214 of the blanket dielectric layer 204, which may have been protected from the ions 302 by the first gate electrode 208 and hard mask 210.

Figure 8:
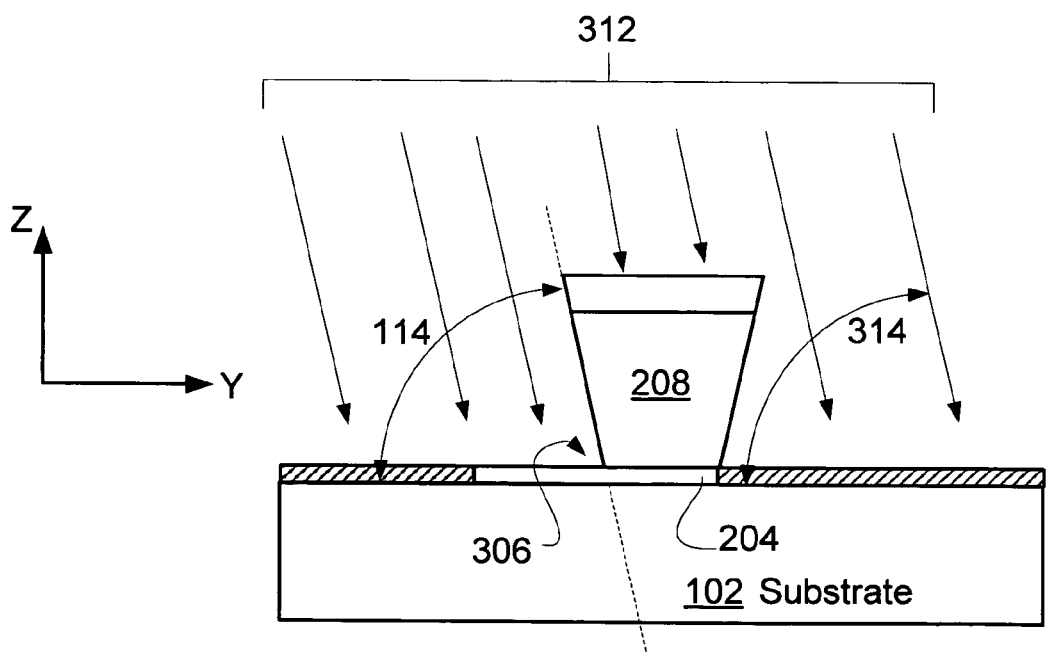
FIG. 8 is a cross-sectional side view that illustrates a second set of ions being implanted into portions of the blanket dielectric layer in a second ion implantation process.

FIG. 8 is a cross-sectional side view that illustrates a second set of ions 312 being implanted into portions of the blanket dielectric layer 204 in a second ion implantation process. The second set of ions 312 may alter some of the blanket dielectric layer 204 that remained unaltered 214 after the first ion implantation 302. The ions 312 of the second ion implantation may be implanted similarly to the first ions 302 of the first ion implantation.

The ions 304 may be implanted at an angle 314 of ion implantation similar to the angle of the other sidewall of the gate electrode 208. For example, in FIG. 6, the ions 302 are implanted at an angle 304 similar to the angle 114 of the right-hand sidewall of the gate electrode 208. In FIG. 8, the ions 312 are therefore implanted at an angle 314 similar to the angle 114 of the left-hand sidewall, and angle 314 is oriented in substantially the same direction as angle 114 of the left-hand sidewall. In other words, if both sidewalls of the gate electrode 208 are at an angle of eighty five degrees from the plane of the top surface of the substrate 102, ions 302, 312 of both ion implantations may be implanted at angles 304, 314 similar to eighty five degrees; if both implantations are at eighty-five degrees, there is a ten degree difference between the two implantation angles 304, 314. In an embodiment, the angle 314 of ion implantation is within about five degrees of the left sidewall angle 114. In an embodiment, the angle 314 of ion implantation is within about two degrees of the sidewall angle 114. In an embodiment, the angle 314 of ion implantation is between about equal to the sidewall angle 114 and about five degrees less than the sidewall angle 114 (e.g., if there is 85 degrees between the sidewall and the X-Y plane, the angle 314 is between about 85 degrees and about 80 degrees in such an embodiment). In an embodiment, the angle 314 of ion implantation is between about equal to the sidewall angle 114 and about two degrees less than the sidewall angle 114. This second ion 312 implantation may occur after the first ion 302 implantation, or may occur substantially simultaneously.

Figure 9:
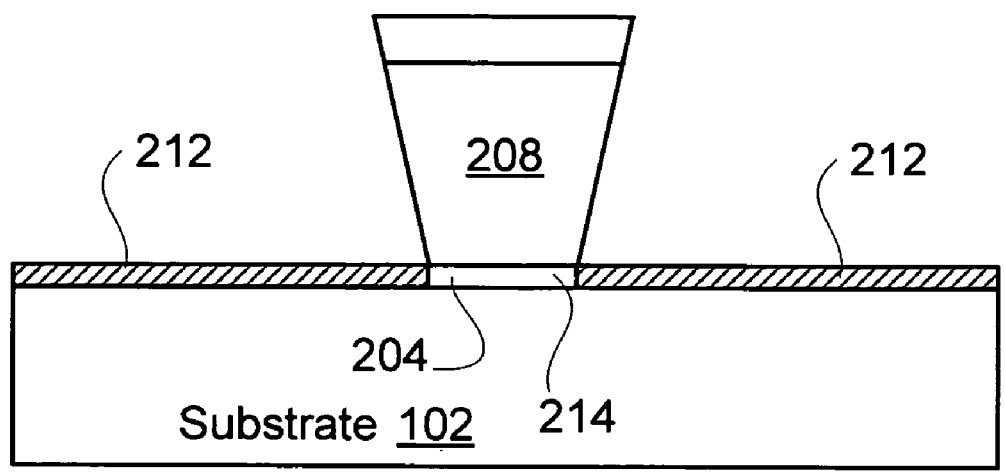
FIG. 9 is a cross-sectional side view that illustrates altered regions of the blanket dielectric layer after the second ion implantation.

FIG. 9 is a cross-sectional side view that illustrates altered regions 212 of the blanket dielectric layer 204 after the second ion 312 implantation, according to one embodiment. As seen in FIG. 9, much or all of the exposed portion of the blanket dielectric layer 204 (the portion not covered by the gate electrode 208) has been converted to an altered region 212. The second ion 312 implantation has altered much or all of the blanket dielectric layer 204 that had been shadowed by the gate electrode 208 during the first ion 302 implantation. Thus, after the second ion 312 implantation, much or all of the exposed portion of the blanket dielectric layer 204 has been altered or damaged by ion implantation, making the damaged region 212 more susceptible to a selected wet etchant.

Figure 10:
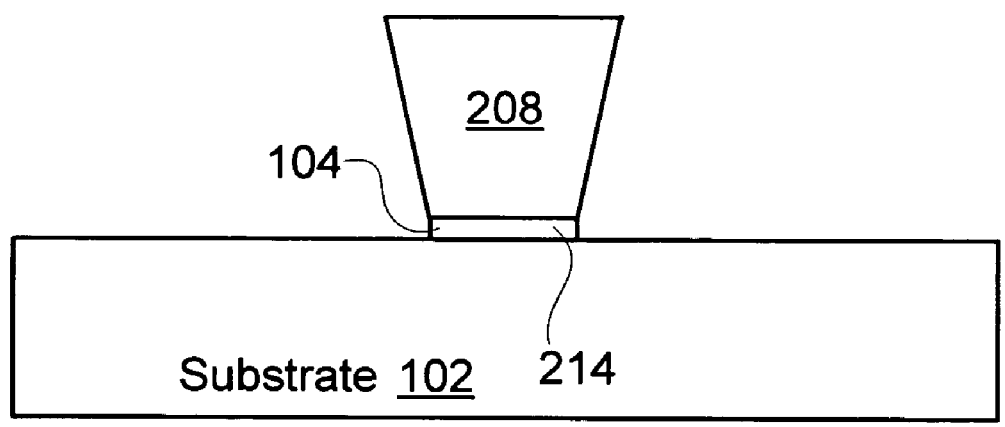
FIG. 10 is a cross-sectional side view that illustrates the formation of the gate dielectric layer by removal of the damaged region of the blanket dielectric layer.

FIG. 10 is a cross-sectional side view that illustrates the formation of the gate dielectric layer 104 by removal of the damaged region 212 of the blanket dielectric layer 204, according to one embodiment. Because the angled ion implantations may provide a highly anisotropic alteration of the blanket dielectric layer 204, and the etchant may be highly selective to the altered portions 212 of the blanket dielectric layer 204, the gate dielectric layer 104 may be formed that has little or no footings 120 or undercuts 118, as described above with respect to FIGS. 1b and 1c, which may result in a device 100 that performs better than it would with a gate dielectric layer 104 with large footings 120 or undercuts 118. Suitable etchants that may be used to remove the altered regions 212 of the blanket dielectric layer 204 include but are not limited to phosphoric acid ($H_3PO_4$), hydrofluoric acid (HF), buffered HF, hydrochloric acid (HCl), sulfuric acid ($H_2SO_4$), nitric acid ($HNO_3$), acetic acid ($CH_3COOH$), sodium hydroxide (NaOH), potassium hydroxide (KOH), ammonium hydroxide ($NH_4OH$), alcohols, potassium permanganate ($KMnO_4$), ammonium fluoride ($NH_4F$), tetramethyl ammonium hydroxide (TMAH), and others. In an embodiment, a buffered hydrofluoric acid with a pH of about 4 may be used.

Figure 11:
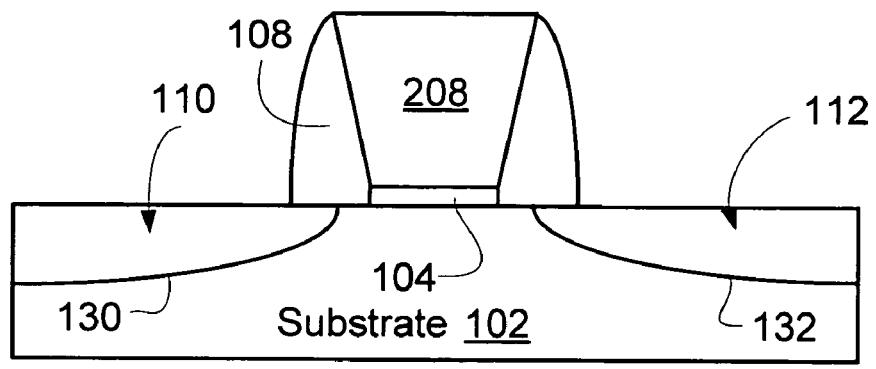
FIG. 11 is a cross-sectional side view that illustrates spacers formed adjacent the sidewalls of the gate electrode and source and drain regions formed in the substrate.

FIG. 11 is a cross-sectional side view that illustrates spacers 108 formed adjacent the sidewalls of the gate electrode 208 and source and drain regions 110, 112 formed in the substrate, according to an embodiment. The source and drain regions 110, 112 may be formed by doping regions of the substrate 102 in an embodiment. In another embodiment, the source and drain regions 110, 112 may be formed be removing portions of the substrate 102 to form recesses 130, 132, then filling the recesses 130, 132 with a source/drain material. Such a material may extend beyond the top surface of the substrate 102, and may be doped during formation or after formation. Other suitable methods to make source and drain regions 110, 112 may also be used. Any suitable method may be used to make the spacers 108.

Figure 12:
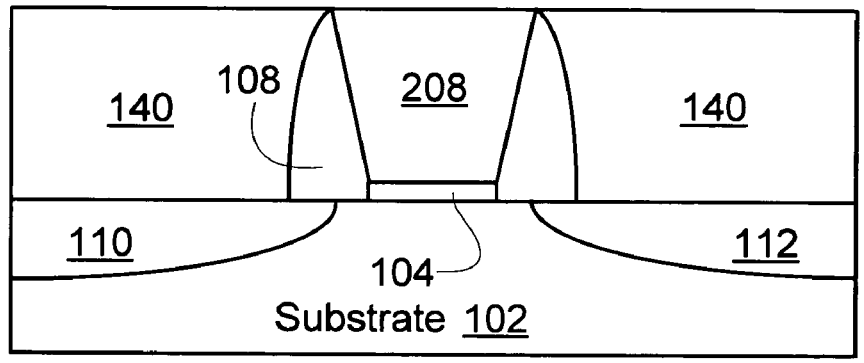
FIG. 12 is a cross-sectional side view that illustrates a first interlayer dielectric layer (ILD layer).

FIG. 12 is a cross-sectional side view that illustrates a first interlayer dielectric layer (ILD layer) 140, according to an embodiment. Note that the first ILD layer 140 may be present in the device 100 shown in FIG. 1a; it was left out of the Figure for simplicity. Any suitable material may be used as the ILD layer 140. Excess material of the ILD layer 140 may have been placed on the substrate 102 and gate electrode 208. The excess material above the top surface of the gate electrode 208 may be removed to expose the top surface of the first gate electrode 208, as is illustrated in FIG. 12.

Figure 13:
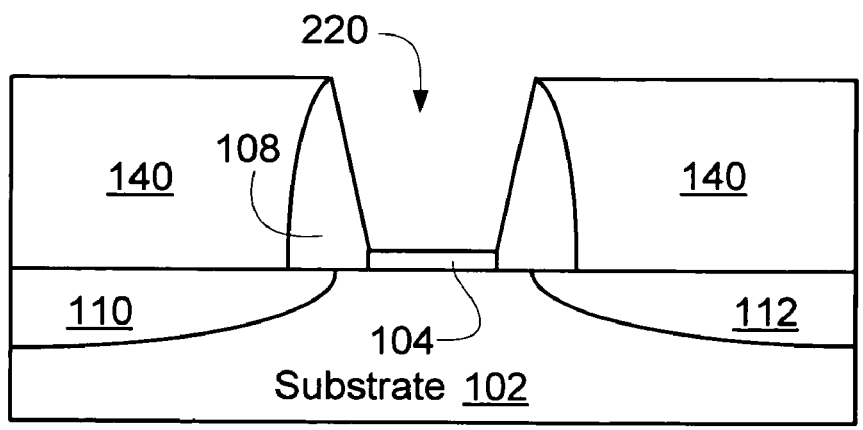
FIG. 13 is a cross-sectional side view that illustrates a trench formed by removal of the first gate electrode.

FIG. 13 is a cross-sectional side view that illustrates a trench 220 formed by removal of the first gate electrode 208, according to one embodiment. The first gate electrode 208 may be removed by any suitable method. Note that while FIG. 13 shows the first gate electrode 208 completely removed, in some embodiments, a portion of the first gate electrode 208 may remain in place. For example, if the first gate electrode 208 comprises a polysilicon layer and an intermediate layer between the polysilicon layer and the gate dielectric 104, the intermediate layer may be left behind in some embodiments. Further, FIGS. 13 through 15 only illustrate embodiments where all or part of the first gate electrode 208 is removed and replaced with a replacement gate electrode comprising one or more gate electrode layers, which may also be referred to as "replacement gate electrode layers." In other embodiments, the first gate electrode 208 may be left in place and used as the gate electrode 106 of the device 100 after fabrication.

Figure 14:
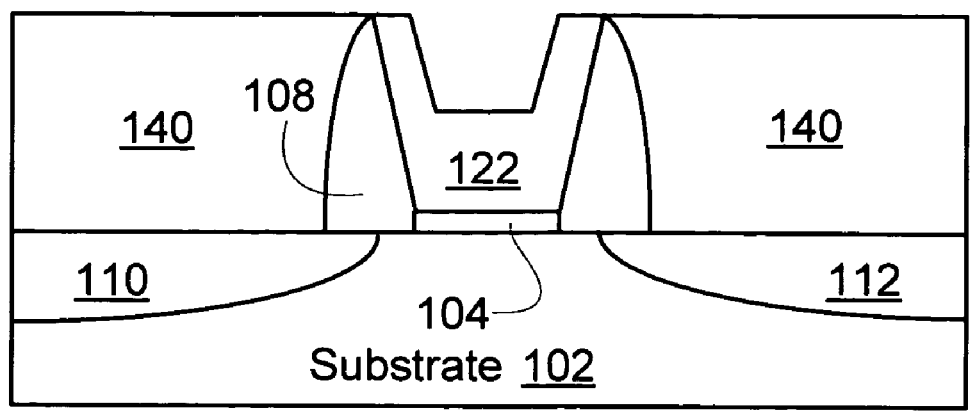
FIG. 14 is a cross-sectional side view that illustrates a first metal gate electrode layer formed in the trench.

FIG. 14 is a cross-sectional side view that illustrates a first metal gate electrode layer 122 formed in the trench 220, according to one embodiment. As illustrated in FIG. 14, the first metal gate layer 122 is conformal to the trench bottom and sidewalls, similar to the embodiment discussed with respect to FIG. 1e. Any suitable method may be used to form the first metal gate layer 122. The first gate electrode layer 122 may comprise other suitable materials besides metal.

Figure 15:
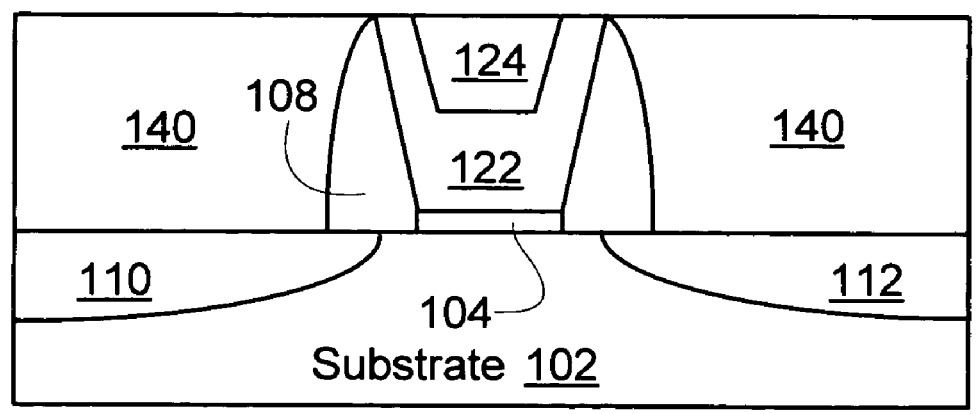
FIG. 15 is a cross-sectional side view that illustrates the second gate electrode layer formed on the first metal gate layer.

FIG. 15 is a cross-sectional side view that illustrates the second gate electrode layer 124 formed on the first metal gate layer 122, according to one embodiment. In an embodiment, the second gate electrode layer 124 may fill remaining portions of the trench 220 not filled by the first gate electrode layer 122 and other layers, to result in the gate electrode 106.

The second gate electrode layer 124 may comprise a metal, polysilicon, or another material.

Additional gate electrode layers beyond the first and second gate electrode layers 122, 124 may also be formed in the trench 220 and form part of the final gate electrode 106. Alternatively, only one layer may be formed in the trench 220, and that one layer may make up the gate electrode 106.

While FIGS. 14 and 15 illustrate the first gate electrode layer 122 being conformal to the trench 220 and the second gate electrode layer 124 being on the first gate electrode layer 122, the first gate electrode layer 122 may be formed within the trench 220 in a less or non-conformal manner and the second gate electrode layer 124 formed on the first gate electrode layer 122 and adjacent the trench 220 sidewalls, to result in the gate electrode 106 illustrated in FIG. 1d.

As the trench 220 is wider towards the top than at the bottom because of the reverse-tapered shape of gate electrode 208, it is easier to form the layer or layers that form the gate electrode 106 than if the trench had straight walls or was tapered. Such a reverse-tapered shape helps avoid the formation of voids, such as when a material being deposited bridges the gap at the top of the trench 220 prior to lower volumes of the trench 220 being filled.

Additional process steps may be performed to complete the device 100, as will be appreciated by those of skill in the art.

Figure 16:
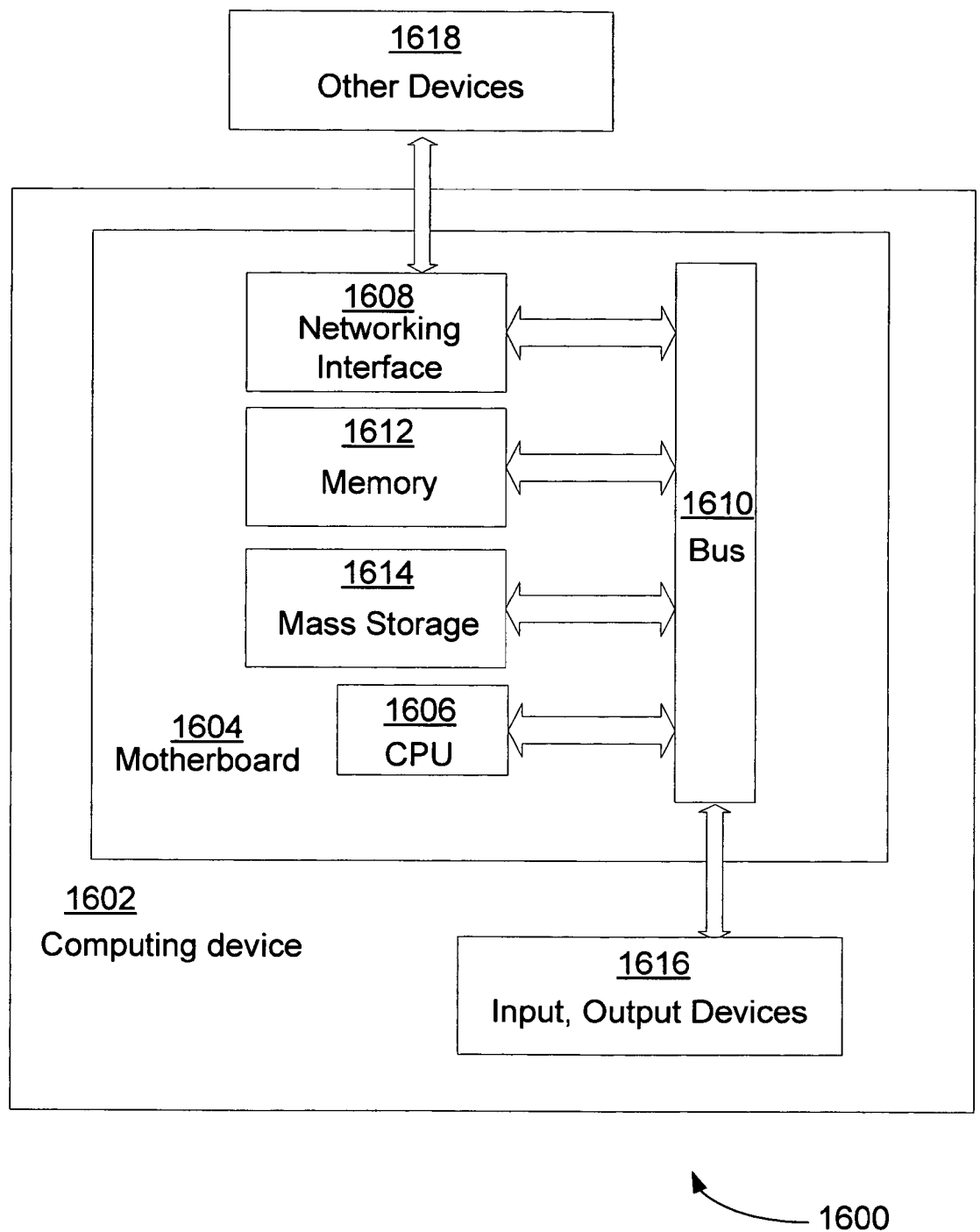
FIG. 16 is a block diagram that illustrates a system in accordance with one embodiment of the present invention.

FIG. 16 is a block diagram that illustrates a system 1600 in accordance with one embodiment of the present invention. One or more devices 100 with reverse-tapered gate electrodes 106 and dielectric layers 104 with little to no footings 120 or undercuts 118 as described above may be included in the system 1600 of FIG. 16. As illustrated, for the embodiment, system 1600 includes a computing device 1602 for processing data. Computing device 1602 may include a motherboard 1604. Coupled to or part of the motherboard 1604 may be in particular a processor 1606, and a networking interface 1608 coupled to a bus 1610. A chipset may form part or all of the bus 1610. The processor 1606, chipset, and/or other parts of the system 1606 may include one or more devices 100 as described above.

Depending on the applications, system 1600 may include other components, including but are not limited to volatile and non-volatile memory 1612, a graphics processor (integrated with the motherboard 1604 or connected to the motherboard as a separate removable component such as an AGP or PCI-E graphics processor), a digital signal processor, a crypto processor, mass storage 1614 (such as hard disk, compact disk (CD), digital versatile disk (DVD) and so forth), input and/or output devices 1616, and so forth.

In various embodiments, system 1600 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Any of one or more of the components 1606, 1614, etc. in FIG. 16 may include one or more device 100 as described herein. For example, a transistor 100 may be part of the CPU 1606, motherboard 1604, graphics processor, digital signal processor, or other devices.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method, comprising:
   forming a blanket dielectric layer on a substrate;
   forming a reverse-tapered gate electrode on the blanket dielectric layer, an exposed portion of the blanket dielectric layer being adjacent side walls of the gate electrode;
   implanting ions into the exposed portion of the blanket dielectric layer, the ions being implanted at an angle between about that of a first sidewall angle of a first reverse-tapered gate electrode sidewall and about two degrees less than the first sidewall angle; and
   etching the exposed implanted portion to remove substantially all the exposed implanted portion and leave behind a gate dielectric layer.

2. The method of claim 1, wherein forming the reverse-tapered gate electrode comprises:
   forming a blanket gate electrode layer on a substrate; and
   removing portions of the blanket gate electrode layer to leave behind a gate electrode with a gate length adjacent the blanket dielectric layer, the gate electrode having reverse-tapered sidewalls so the gate electrode has an intermediate length further from the gate dielectric layer than the gate length, the intermediate length being greater than the gate length.

3. The method of claim 2, further comprising:
   forming, after forming the gate electrode and the gate dielectric layer, spacers adjacent the gate electrode sidewalls;
   removing the gate electrode to leave behind a trench between the spacers; and
   forming a replacement gate electrode in the trench.

4. The method of claim 3, wherein forming a replacement gate electrode in the trench comprises forming a first metal gate electrode layer, the first metal gate electrode layer being conformal to a bottom of the trench and side walls of the trench.

5. The method of claim 4, wherein the first metal gate electrode layer does not completely fill the trench and wherein forming a replacement gate electrode in the trench further comprises forming a second gate electrode layer on the first metal gate electrode layer in the trench.

6. The method of claim 2, wherein at least a portion of each of the reverse-tapered gate electrode sidewalls has a sidewall angle between the reverse-tapered gate electrode sidewalls and a top surface of the substrate, the sidewall angle being between about eighty-five degrees and about seventy-five degrees.

7. The method of claim 6, wherein the ions are implanted at an angle between about that of the sidewall angle and about two degrees less than the sidewall angle.

8. The method of claim 1, wherein at least a portion of the reverse-tapered gate electrode sidewalls has a sidewall angle between the gate electrode sidewalls and the substrate and wherein implanting ions further comprises:

performing a second ion implantation process after the first ion implantation process, during which ions are implanted at an angle between about that of a second sidewall angle of a second reverse-tapered gate electrode sidewall opposite the first reverse-tapered gate electrode sidewall and about two degrees less than the second sidewall angle.

* * * * *

UNITED STATES PATENT AND TRADEMARK OFFICE
CERTIFICATE OF CORRECTION

PATENT NO. : 7,595,248 B2
APPLICATION NO. : 11/293753
DATED : September 29, 2009
INVENTOR(S) : Hattendorf et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 766 days.

Signed and Sealed this

Twenty-eighth Day of September, 2010

David J. Kappos
*Director of the United States Patent and Trademark Office*